United States Patent
Ji et al.

(10) Patent No.: US 9,733,563 B2
(45) Date of Patent: Aug. 15, 2017

(54) PHOTOSENSITIVE RESIN COMPOSITION AND PHOTOSENSITIVE MATERIAL COMPRISING THE SAME

(75) Inventors: Ho Chan Ji, Daejeon (KR); Sunghyun Kim, Daejeon (KR); Dongchang Choi, Daejeon (KR); Kyung Soo Choi, Hannam-si (KR); Geun Young Cha, Daejeon (KR); Sang Chul Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/353,066

(22) Filed: Jan. 18, 2012

(65) Prior Publication Data

US 2012/0189961 A1 Jul. 26, 2012

(30) Foreign Application Priority Data

Jan. 18, 2011 (KR) .................... 10-2011-0005084

(51) Int. Cl.
| | | |
|---|---|---|
| G03F 7/032 | (2006.01) | |
| G03F 7/027 | (2006.01) | |
| G03F 7/00 | (2006.01) | |
| G03F 7/004 | (2006.01) | |

(52) U.S. Cl.
CPC .......... *G03F 7/0007* (2013.01); *G03F 7/0048* (2013.01); *G03F 7/027* (2013.01); *G03F 7/032* (2013.01)

(58) Field of Classification Search
CPC ...... G03F 7/0007; G03F 7/0048; G03F 7/027; G03F 7/032
See application file for complete search history.

(56) References Cited

U.S. PATENT DOCUMENTS

| | | | | |
|---|---|---|---|---|
| 2003/0091844 A1* | 5/2003 | Inaba et al. | .................... | 428/480 |
| 2008/0081270 A1* | 4/2008 | Tanaka | .............................. | 430/7 |
| 2008/0255297 A1* | 10/2008 | Itami et al. | .................... | 524/547 |
| 2010/0201925 A1* | 8/2010 | Kim | ........................ | C08F 20/30 349/106 |
| 2010/0253888 A1* | 10/2010 | Tanaka et al. | ................ | 349/106 |
| 2011/0086938 A1* | 4/2011 | Nishikawa et al. | .......... | 522/162 |
| 2011/0101268 A1 | 5/2011 | Choi et al. | | |
| 2011/0151379 A1* | 6/2011 | Choi et al. | ................. | 430/270.1 |

FOREIGN PATENT DOCUMENTS

| | | |
|---|---|---|
| CN | 101794075 A | 8/2010 |
| JP | 2003-113205 A | 4/2003 |
| JP | 2007-034119 A | 2/2007 |
| JP | 2008-107773 A | 5/2008 |
| JP | 2009-40955 A | 2/2009 |
| JP | 2009-157235 A | 7/2009 |
| JP | 2009-175724 A | 8/2009 |
| JP | 2009-244807 A | 10/2009 |
| JP | 2010-217872 A | 9/2010 |
| KR | 2006-0086999 A | 8/2006 |
| KR | 10-2007-00080619 A | 8/2007 |
| KR | 10-2008-0029931 A | 4/2008 |
| KR | 10-0655044 B1 | 11/2008 |
| KR | 10-2009-0073035 A | 7/2009 |
| TW | 200949437 A1 | 12/2009 |
| WO | 2009113275 A | 9/2009 |
| WO | WO-2009/113275 A1 * | 9/2009 |
| WO | WO 2009/113275 A1 * | 9/2009 |
| WO | 2010036080 A2 | 4/2010 |

OTHER PUBLICATIONS

English translation of WO2009/113275-A1 which is indicated as JP 2009/113275 A1 in AIPN, from machine translation from AIPN Japan Patent Office National Center for Industrial Property Information and Training, generated Apr. 2, 2014, 24 pages.*
English translation of KR 1020070080619 A as published Aug. 10, 2007, generated from ProQuest Patents dated Jul. 9, 2014, pp. 2 of 2, 12 of 12 and 3 of 3.*
Derwent-ACC-No. 2009-N70682, Abstract of WO 2009113275 A1 and TW 200949437 A downloaged May 3, 2015, 6 pages.*
Machine English translation of WO 2009/113275 A1 generated by Google translate obtaied for WIPO website on May 2, 2015., 26 pages.*
Office Action issued in Taiwanese Patent Application No. 101101801 on Nov. 22, 2013 along with English translation, 9 pages.
Office Action issued by the Japanese Patent Office in corresponding Appln. No. 2013-548369, dated Jun. 24, 2014, 14 pgs.
International Search Report issued in International Appln. No. PCT/KR2012/000364 dated Sep. 27, 2012, 2 pages.
Written Opinion issued in International Appln. No. PCT/KR2012/000364 dated Sep. 27, 2012 along with English translation, 10 pages.
Office Action issued in Korean Appln. No. 10-2012-0005007 dated Mar. 20, 2014 along with English translation, 14 pages.
Final Rejection issued for corresponding Japanese Patent Application No. 2013-548369 dated Nov. 4, 2014 with English translation, 11 pages.
First Rejection issued for corresponding Taiwanese Patent Application No. 101101801 dated Nov. 27, 2014 with English translation, 6 pages.

(Continued)

*Primary Examiner* — Cynthia Hamilton
(74) *Attorney, Agent, or Firm* — Rothwell, Figg, Ernst & Manbeck, P.C.

(57) ABSTRACT

The present invention relates to a photosensitive resin composition and a photosensitive material comprising the same. The photosensitive resin composition according to an exemplary embodiment of the present invention may comprise two multi-functional monomers where structures of side chains comprising unsaturated double bonds are different from each other while a composition ratio is changed. Accordingly, in the exemplary embodiment of the present invention, processability is excellent, and it is possible to decrease defects by a rupture when a LCD substrate is sealed and substrate separation defects due to an impact to the LCD products by improving an adhesion property to a lower substrate after a hard baking process.

11 Claims, 7 Drawing Sheets

(56) References Cited

OTHER PUBLICATIONS

First Office Action issued in Chinese Patent Application No. 2012800053027 dated Feb. 28, 2015 along with English translation, 16 pages.
Office Action issued in Taiwanese Patent Application No. 101101801 dated Feb. 3, 2016 along with partial English translation, 17 pages.
Office Action issued in Chinese Patent Application No. 2012800053021 dated Apr. 19, 2016 along with its English translation, 15 pages.
Second Office Action issued in Chinese Patent Application No. 201280005302.7 dated Oct. 26, 2015 along with a partial English translation, 14 pages.

* cited by examiner

PHOTOSENSITIVE RESIN COMPOSITION AND PHOTOSENSITIVE MATERIAL COMPRISING THE SAME

TECHNICAL FIELD

This application claims priority from Korean Patent Application No. 10-2011-0005084 filed on Jan. 18, 2011 in the KIPO, the disclosure of which is incorporated herein by reference in its entirety.

The present invention relates to a photosensitive resin composition and a photosensitive material comprising the same.

BACKGROUND ART

In general, a lattice type black pattern, which is called a black matrix, is disposed between color pixels of a color filter for the purpose of improving contrast. In a known black matrix, a method for forming a pattern by depositing chrome (Cr) as a pigment on the entire surface of a glass substrate and etching the surface is used, but a high cost is required in a process, and a problem of high reflectivity of chrome and a problem of environmental pollution due to chrome waste water occur.

For such reason, there have been active studies on a black matrix using a pigment dispersion method that can perform fine processing, and there has been a study for manufacturing a black composition as a coloring pigment other than carbon black. However, since the coloring pigment other than carbon black has a weak light blocking property, a mixing amount should be significantly increased, such that there are problems in that it is difficult to handle the composition because viscosity of the composition is increased or strength of the formed film or adhesion property to the substrate is remarkably decreased.

Currently, in accordance with a growing need for a continuous improvement in performance in the industry, many studies of the photosensitive resin composition have been made. For example, there are various compositions such as a color filter composition to which a binder newly developed to improve sensitivity is applied, a black matrix resin composition where sensitivity is improved by using a high sensitive photopolymerization initiator, a photopolymerization initiator, and a black matrix resin composition where sensitivity is improved by introducing an organic phosphoric acid compound thereto.

DETAILED DESCRIPTION OF THE INVENTION

Technical Problem

The present invention has been made in an effort to provide a photosensitive resin composition having excellent pattern adhesion property and process property, and a photosensitive material comprising the same.

Technical Solution

An exemplary embodiment of the present invention provides a photosensitive resin composition, comprising: an alkali-soluble binder resin, a multi-functional monomer, a photoinitiator, and a solvent, wherein the multi-functional monomer comprises a first monomer represented by the following Formula 1 or Formula 2 and a second monomer represented by the following Formula 5 or Formula 6:

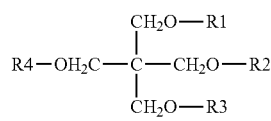
[Formula 1]

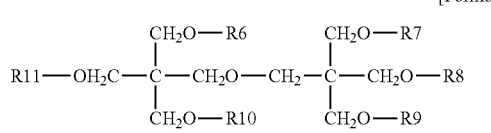
[Formula 2]

wherein
at least one of R1 to R4 and at least one of R6 to R11 are represented by the following Formula 3, and remains are each independently hydrogen, a halogen group, or represented by the following Formula 4,

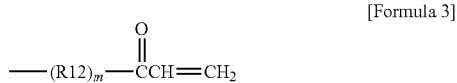
[Formula 3]

wherein
R12 is an alkyleneoxide group or 6-hexanoate group, and m is 1 to 18,

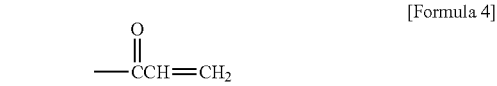
[Formula 4]

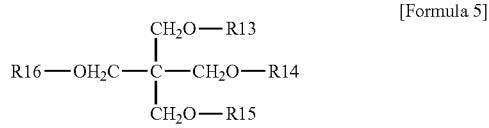
[Formula 5]

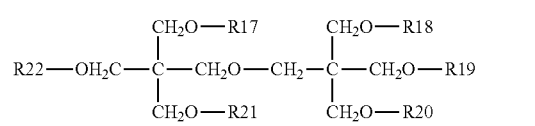
[Formula 6]

wherein
at least two of R13 to R16 and at least two of R17 to R22 are represented by Formula 4, and remains are each independently hydrogen or a halogen group.

Another exemplary embodiment of the present invention provides a photosensitive material formed by using the photosensitive resin composition.

Yet another exemplary embodiment of the present invention provides a method of manufacturing a photosensitive material, comprising 1) coating the photosensitive resin composition on a substrate, and 2) exposing and developing the coated photosensitive resin composition.

Advantageous Effects

The photosensitive resin composition according to an exemplary embodiment of the present invention may comprise two multi-functional monomers where structures of side chains comprising unsaturated double bonds are different from each other while a composition ratio is changed. Accordingly, in the exemplary embodiment of the present invention, processability is excellent, an adhesion property to a lower substrate after a hard baking process can be improved, and it is possible to decrease defects by a rupture when a LCD substrate is sealed and substrate separation defects due to an impact to the LCD products.

BEST MODE

Figure 1:
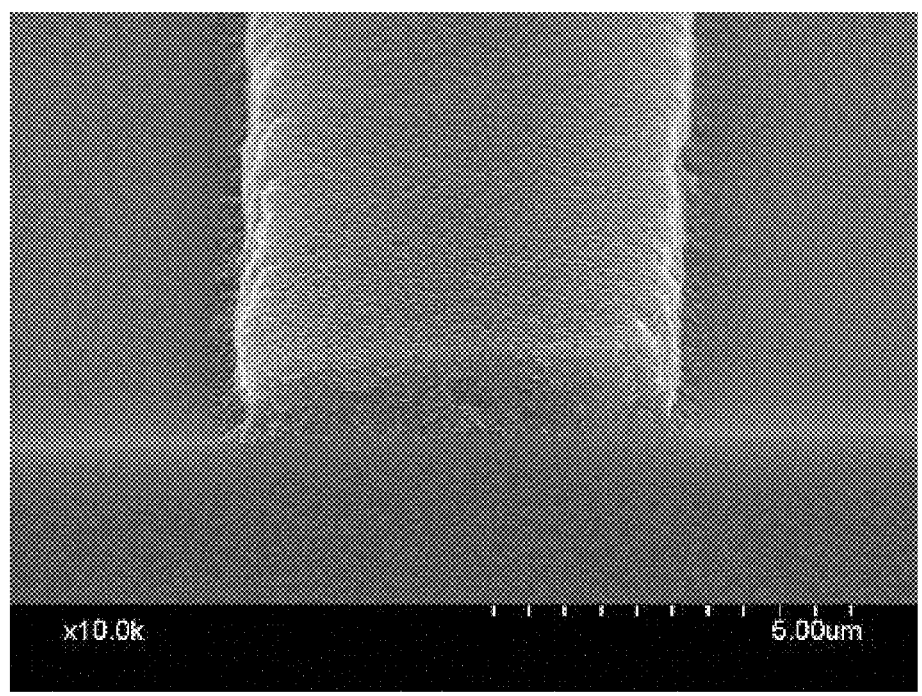
FIG. 1 is a microscopic picture of a black matrix film of Example 1 of an exemplary embodiment of the present invention.

Hereinafter, an exemplary embodiment of the present invention will be described in detail.

Recently, the importance of an LCD in a flat panel display field has rapidly increased. In the LCD field comprising known small- and medium-sized mobile displays or monitors as primary products, the primary products are moving toward large-sized monitors or TVs. When a screen is enlarged, high sensitivity is required in order to shorten a process time. In addition, as the size of the screen is increased, a problem in brightness occurs, such that a lighter backlight is adopted. Since lightness of the backlight is increased, it is required that the black matrix has higher light blocking property as compared to a known matter.

Accordingly, as the content of carbon black used in the composition is continuously increased in order to improve the light blocking property, process properties of the black matrix are continuously deteriorated, such that a process margin is decreased, many defects are formed in each process step, and a production yield is decreased. Since it is difficult to implement high sensitivity due to high light blocking property of high carbon content and amounts of a binder resin providing adhesion strength to the substrate after hard bake, a multi-functional monomer, a photopolymerization initiator, and other additives are relatively decreased, the adhesion strength between the formed black matrix coat and the substrate is decreased, such that the black matrix coat and the substrate are separated during a liquid crystal injection process after the attachment of the substrate, and thus defects of rupture of a seal frequently occur.

Various binder resins and silane coupling agents are developed and applied as a method for solving the aforementioned problems, but the binder resin is disadvantageous in that changing is not easy because the process property and physical properties of the formed black matrix pattern are significantly affected, and the silane coupling agent has a problem in that the improvement effect of the adhesion strength to the substrate is not large.

Accordingly, the exemplary embodiment of the present invention provides a photosensitive resin composition having excellent substrate adhesion property and process margin and a photosensitive material comprising the same in order to solve the aforementioned problems according to an increase in content of the colorant.

A photosensitive resin composition according to the exemplary embodiment of the present invention comprises an alkali-soluble binder resin, a multi-functional monomer, a photoinitiator, and a solvent, wherein the multi-functional monomer comprises a first monomer represented by Formula 1 or Formula 2 and a second monomer represented by Formula 5 or Formula 6.

The photosensitive resin composition according to an exemplary embodiment of the present invention may comprise two multi-functional monomers where structures of side chains comprising unsaturated double bonds are different from each other while a composition ratio is changed. Accordingly, in the exemplary embodiment of the present invention, processability is excellent, an adhesion property to a lower substrate after a hard baking process can be improved, and it is possible to decrease defects by a rupture when a LCD substrate is sealed and substrate separation defects due to an impact to the LCD products.

In the photosensitive resin composition according to the exemplary embodiment of the present invention, substituent groups of Formula 1 to 6 will be described below in more detail.

As the halogen group, there may be fluorine, chlorine, bromine, and iodine, but the group is not limited thereto.

As detailed examples of the alkylene oxide group, there may be a methylene oxide group, an ethylene oxide group, and the like, but the examples are not limited thereto.

In the photosensitive resin composition according to the exemplary embodiment of the present invention, the content of the first monomer may be 30 to 70 wt % on the basis of the total weight of the multi-functional monomer. In the case where the content of the first monomer is less than 30 wt % on the basis of the total weight of the multi-functional monomer, there may be a problem in that even though processability is excellent, an improvement in adhesion property to the substrate after hard bake is not large, and in the case where the content is more than 70 wt %, there may be a problem in that even though the adhesion property to the substrate after hard bake is excellent, the pattern removal occurs and the number of unsaturated double bonds per unit mass is decreased during a developing process, such that an upper portion of the pattern is etched because it is impossible to obtain sufficient crosslinking density of the film.

As the first monomer, one or more of KAYARAD DPCA-20, KAYARAD DPCA-30, KAYARAD DPCA-60, KAYARAD DPCA-120, KAYARAD DPEA-12, and the like manufactured by Nippon Kayaku, Co., Ltd. may be used, but the first monomer is not limited thereto.

As the second monomer, one or more of pentaerythritol tetra(meth)acrylate, pentaerythritol tri(meth)acrylate, dipentaerythritol penta(meth)acrylate, dipentaerythritol hexa(meth)acrylate, and the like may be used, but the second monomer is not limited thereto.

The content of the second monomer may be 30 to 70 wt % on the basis of the total weight of the multi-functional monomer.

In the photosensitive resin composition according to the exemplary embodiment of the present invention, the content of multi-functional monomer may be 1 to 10 wt % on the basis of the total weight of the photosensitive resin composition.

In the photosensitive resin composition according to the exemplary embodiment of the present invention, as the alkali-soluble binder resin, a copolymerization resin of a monomer for providing mechanical strength and a monomer for providing alkali solubility may be used.

As the monomer that can be contributed to mechanical strength of the film, one or more unsaturated ester carboxylates selected from the group consisting of benzyl(meth) acrylate, methyl(meth)acrylate, ethyl(meth)acrylate, butyl (meth)acrylate, dimethylaminoethyl(meth)acrylate, isobutyl (meth)acrylate, t-butyl(meth)acrylate, cyclohexyl(meth) acrylate, isobornyl(meth)acrylate, ethylhexyl(meth)acrylate, 2-phenoxyethyl(meth)acrylate, tetrahydrofurfuryl(meth) acrylate, hydroxyethyl(meth)acrylate, 2-hydroxypropyl (meth)acrylate, 2-hydroxy-3-chloropropyl(meth)acrylate, 4-hydroxybutyl(meth)acrylate, acyloctyloxy-2-hydroxypropyl(meth)acrylate, glycerol(meth)acrylate, 2-methoxyethyl (meth)acrylate, 3-methoxybutyl(meth)acrylate, ethoxydiethyleneglycol(meth)acrylate, methoxytriethyleneglycol(meth) acrylate, methoxytripropyleneglycol(meth)acrylate, poly (ethyleneglycol)methylether(meth)acrylate, phenoxydiethyleneglycol(meth)acrylate, p-nonylphenoxypolyethyleneglycol(meth)acrylate, p-nonylphenoxypolypropyleneglycol(meth)acrylate, glycidyl(meth)acrylate, tetrafluoropropyl(meth)acrylate, 1,1,1,3,3,3-hexafluoroiopropyl (meth)acrylate, octafluoropentyl(meth)acrylate, heptadecafluorodecyl(meth)acrylate, tribromophenyl(meth) acrylate, dicyclopentanyl(meth)acrylate, dicyclopentenyl (meth)acrylate, dicyclopentenyloxyethylacrylate, isobonylmethacrylate, adamentylmethacrylate, methyl α-hydroxymethyl acrylate, ethyl α-hydroxymethyl acrylate, propyl α-hydroxymethyl acrylate, and butyl α-hydroxymethyl acrylate;

one or more aromatic vinyls selected from the group consisting of styrene, α-methylstyrene, (o,m,p)-vinyl toluene, (o,m,p)-methoxy styrene, and (o,m,p)-chloro styrene;

one or more unsaturated ethers selected from the group consisting of vinyl methyl ether, vinyl ethyl ether, and allyl glycidyl ether;

one or more unsaturated imides selected from the group consisting of N-phenyl maleimide, N-(4-chlorophenyl)maleimide, N-(4-hydroxyphenyl)maleimide, and N-cyclohexyl maleimide; and one or more and preferably two or more maleic anhydrides selected from the group consisting of maleic anhydride, and methylmaleic anhydride may be used, but the monomer is not limited thereto.

In addition, as the monomer for providing alkali solubility, one or more selected from the group consisting of a (meth)acrylic acid, a crotonic acid, an itaconic acid, a maleic acid, a fumaric acid, a monomethyl maleic acid, a 5-nobonen-2-carboxylic acid, mono-2-((meth)acryloyloxy)ethyl phthalate, mono-2-((meth)acryloyloxy)ethyl succinate, and ω-carboxypolycaprolactone mono(meth)acrylate are preferably used, but the monomer is not limited thereto.

In addition, a binder resin represented by the following Formula 7 as well as the monomers may be used.

[Formula 7]

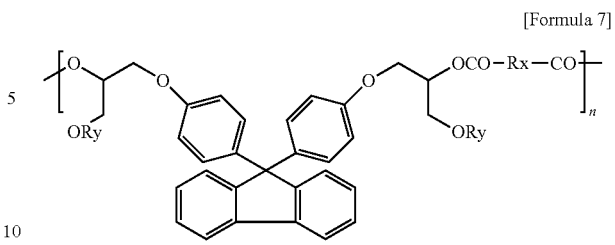

In Formula 7, Rx is a structure that forms an ester bond by addition reacting pentanary cyclic carboxylic anhydride or diisocyanate, Ry is selected from hydrogen, acryloyl, and methaacryloyl, and n is 3 to 8.

As examples of detailed compounds of carboxylic anhydride constituting Rx, there are one or more selected from the group consisting of succinic anhydride, methylsuccinic anhydride, 2,2-dimethylsuccinic anhydride, isobutenylsuccinic anhydride, 1,2-cyclohexanedicarboxylic anhydride, hexahydro-4-methylphthalic anhydride, itaconic anhydride, tetrahydrophthalic anhydride, 5-norbornene-2,3-dicarboxylic anhydride, methel-5-norbornene-2,3-dicarboxylic anhydride, 1,2,3,4-cyclobutanetetracarboxylic dianhydride, maleic anhydride, citraconic anhydride, 2,3,-dimethylmaleic anhydride, 1-cyclopentene-1,2-dicarboxylic dianhydride, 3,4,5,6-tetrahydrophthalic anhydride, phthalic anhydride, bisphthalic anhydride, 4-methylphthalic anhydride, 3,6-dichlorophthalic anhydride, 3-hydrophthalic anhydride, 1,2,4-benzenetricarboxylic anhydride, 4-nitrophthalic anhydride, and diethyleneglycol-1,2-bistrimellitic anhydride, but the compounds are not limited thereto.

As detailed examples of diisocyanate constituting Rx, there are one or more selected from the group consisting of trimethylenediisocyanate, tetramethylenediisocyanate, hexamethylenediisocyanate, pentamethylenediisocyanate, 1,2-propylenediisocyanate, 2,3-butylenediisocyanate, 1,3-butylenediisocyanate, dodecamethylenediisocyanate, 2,4,4-trimethyl hexamethylene diisocyanate, w,w'-diisocyanate-1,3-dimethylbenzene, w,w'-diisocyanate-1,4-dimethylbenzene, w,w'-diisocyanate-1,3-diethylbenzene, 1,4-tetra methyl xylene diisocyanate, 1,3-tetramethyl xylene diisocyanate, isophoronediisocyanate, 1,3-cyclopentanediisocyanate, 1,3-cyclohexanediisocyanate, 1,4-cyclohexanediisocyanate, methyl-2,4-cyclohexanediisocyanate, methyl-2,6-cyclohexane diisocyanate, 4,4'-methylene bisisocyanate methylcyclohexane, 2,5-isocyanatemethyl bicyclo[2,2,2] heptane, and 2,6-isocyanatemethyl bicyclo[2,2,1]heptane, but the examples are not limited thereto.

A weight average molecular weight of the alkali-soluble binder resin may be 1,000 to 50,000 g/mol and 2,000 to 10,000 g/mol. In addition, an acid value of the alkali-soluble binder resin may be 30 to 150 KOH mg/mg.

The content of the alkali-soluble binder resin may be 1 to 10 wt % on the basis of the total weight of the photosensitive resin composition, but is not limited thereto.

In the photosensitive resin composition according to the exemplary embodiment of the present invention, the photoinitiator is a material that promotes crosslinking by generating a radical by light, and one or more compounds selected from the group consisting of an acetophenone-based compound, a biimidazole-based compound, a triazine-based compound, and an oxime-based compound may be mixed and used.

As the acetophenone-based compound, there is a matter selected from the group consisting of 2-hydroxy-2-methyl- 1-phenylpropane-1-one, 1-(4-isopropylphenyl)-2-hydroxy-2-methylpropane-1-one, 4-(2-hydroxyethoxy)-phenyl-(2-hydroxy-2-propyl)ketone, 1-hydroxycyclohexylphenylketone, benzoinmethyl ether, benzoinethyl ether, benzoinisobutyl ether, benzoinbutyl ether, 2,2-dimethoxy-2-phenylacetophenone, 2-methyl-(4-methylthio)phenyl-2-morpholino-1-propane-1-one, 2-benzyl-2-dimethylamino-1-(4-morpholinophenyl)-butane-1-one, 2-(4-bromo-benzyl-2-dimethylamino-1-(4-morpholinophenyl)-butane-1-one and 2-methyl-1-[4-(methylthio)phenyl]-2-morpholinopropane-1-one.

As the biimidazole-based compound, there is one selected from the group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, and 2,2'-bis(o-chlorophenyl)-4,4,5,5'-tetraphenyl-1,2'-biimidazole.

As the triazine-based compound, there is one selected from the group consisting of a 3-{4-[2,4-bis(trichloromethyl)-s-triazine-6-yl]phenylthio}propionic acid, 1,1,1,3,3,3-hexafluoroisopropyl-3-{4-[2,4-bis(trichloromethyl)-s-triazine-6-yl]phenylthio}propionate, ethyl-2-{4-[2,4-bis(trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, a 3-{chloro-4-[2,4-bis(trichloromethyl)-s-triazine-6-yl]phenylthio}propionic acid, 3-{4-[2,4-bis(trichloromethyl)-s-triazine-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3,-butadienyl-s-triazine, and 2-trichloromethyl-4-amino-6-p-methoxystyryl-s-triazine.

As the oxime-based compound, there is 1,2-octadione-1-(4-phenylthio)phenyl-2-(o-benzoyloxime) (Ciba-Geigy, Co., Ltd., CGI 124), and ethanone-1-(9-ethyl)-6-(2-methyl-benzoyl-3-yl)-1-(o-acetyloxime) (CGI 242).

The photoinitiator may be used in the content of 1 to 300 parts by weight on the basis of 100 parts by weight of the total weight of the alkali-soluble binder resin having the unsaturated double bond and the multi-functional monomer having the unsaturated double bond. Particularly, 1 to 30 parts by weight of the acetophenone-based compound, 1 to 30 parts by weight of the biimidazole-based compound, 1 to 30 parts by weight of the triazine-based compound, or 1 to 30 parts by weight of the oxime-based compound may be used.

In addition, the photosensitive resin composition is an auxiliary component of the photoinitiator, and may further comprise 0.01 to 10 parts by weight of a photocrosslinking sensitizer promoting generating of a radical and/or 0.01 to 10 parts by weight of a curing promoter promoting curing on the basis of 100 parts by weight of the photoinitiator.

As the photocrosslinking sensitizer, a benzophenone-based compound such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; a fluorenone-based compound such as 9-fluorenone, 2-chloro-9-fluorenone, and 2-methyl-9-fluorenone; a thioxantone-based compound such as thioxantone, 2,4-diethyl thioxantone, 2-chloro thioxantone, 1-chloro-4-propyloxy thioxantone, isopropylthioxantone, and diisopropylthioxantone; a xantone-based compound such as xantone, and 2-methylxantone; an anthraquinone-based compound such as anthraquinone, 2-methyl anthraquinone, 2-ethyl anthraquinone, t-butyl anthraquinone, and 2,6-dichloro-9,10-anthraquinone; an acridine-based compound such as 9-phenylacridine, 1,7-bis(9-acridinyl)heptane, 1,5-bis(9-acridinylpentane), and 1,3-bis(9-acridinyl)propane; a dicarbonyl compound such as benzyl, 1,7,7-trimethyl-bicyclo[2,2,1]heptane-2,3-dione, and 9,10-penanthrenequinone; a phosphine oxide-based compound such as 2,4,6-trimethylbenzoyl diphenylphosphine oxide, and bis(2,6-dimethoxybenzoyl)-2,4,4-trimethylpentyl phosphine oxide; a benzophenone-based compound such as methyl-4-(dimethylamino)benzoate, ethyl-4-(dimethylamino)benzoate, and 2-n-butoxyethyl-4-(dimethylamino)benzoate; an amino synergist such as 2,5-bis(4-diethylaminobenzale)cyclopentanone, 2,6-bis(4-diethylaminobenzale)cyclohexanone, and 2,6-bis(4-diethylaminobenzale)-4-methyl-cyclopentanone; a coumarine-based compound such as 3,3-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine, and 10,10-carbonylbis[1,1,7,7-tetramethyl-2,3,6,7-tetrahydro-1H,5H,11H—C1]-benzopyrano[6,7,8-ij]-quinolizine-11-one; a chalcone compound such as 4-diethylamino chalcone, and 4-azidebenzaleacetophenone; 2-benzoylmethylene, or 3-methyl-b-naphthothiazoline may be used.

As the curing promoter, one or more selected from the group consisting of 2-mercaptobenzoimidazole, 2-mercaptobenzothiazol, 2-mercaptobenzooxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), and trimethylolpropane-tris(3-mercaptopropionate) may be used.

The content of the photoinitiator may be 0.5 to 5 wt % on the basis of the total weight of the photosensitive resin composition, but is not limited thereto.

As the solvent, one or more of a first solvent having a boiling point in the range of 140 to 159° C., a second solvent having a boiling point in the range of 160 to 179° C., and a third solvent having a boiling point in the range of 180 to 280° C. may be used, or two or more thereof may be mixed. An average boiling point of the total solvent may be 140 to 170° C. In the case where the average boiling point of the total solvent is less than 140° C., stains may be formed due to rapid volatilization during the VCD process, and in the case where the average boiling point of the total solvent is more than 170° C., there may be a problem in that the solvent is not well removed by the VCD process.

As the first solvent component, there may be one or more selected from the group consisting of methyl-3-methoxy propionate (144° C.), ethyleneglycol methylether (125° C.), ethyleneglycol ethylether (135° C.), ethyleneglycol diethylether (121° C.), dibutylether (140° C.), ethylpyruvate (144° C.) propyleneglycol methylether (121° C.), propyleneglycol methylether acetate (146° C.), n-butylacetate (125° C.), isobutylacetate (116° C.), amylacetate (149° C.), isoamylacetate (143° C.), butylpropionate (146° C.), isoamylpropionate (156° C.), ethylbutyrate (120° C.), propyl butyrate (143° C.), methyl-3-methoxyisobutyrate (148° C.), methylglycolate (150° C.), methyl lactate (145° C.), ethyl lactate (154° C.), methyl-2-hydroxyisobutylate (137° C.), ethylethoxyacetate (156° C.), 2-methoxyethylacetate (145° C.), ethyleneglycolmethyletheracetate (145° C.), 2-ethoxyethyl-acetate (156° C.), dibutylether (140° C.), cyclopentanone (131° C.), cyclohexanone (155° C.), 2-hexanone (127° C.), 3-hexanone (123° C.), 5-methyl-2-hexanone (145° C.), 2-heptanone (150° C.), 3-heptanone (148° C.), 4-heptanone (145° C.), 2-methyl-3-heptanone (159° C.), 1-methoxy-2-propanol (118° C.), ethyl-2-hydroxy-propionate (154° C.), and ethyl-3-methoxypropionate (158° C.), but the component is not limited thereto.

As the second solvent, there may be one or more selected from the group consisting of 2-methoxy ethylether (162° C.), 3-methoxybutylacetate (170° C.), 2-ethoxyethyl ether (185° C.), 2-butoxyethanol (171° C.), 3-ethoxy-propanol (161° C.), diethyleneglycoldodecylether (169° C.), dipropyleneglycolmethylether (188° C.), 2,6-dimethyl-4-heptanone (169° C.), 2-octanone (173° C.), 3-octanone (168° C.), 3-nonanone (188° C.), 5-nonanone (187° C.), 4-hydroxy-4-methyl-2-pentanone (166° C.), 2-methylcyclohexanone (163° C.), 3-methylcyclohexanone (170° C.), 4-methylcyclohexanone (170° C.), 2,6-dimethylcyclohexanone (175° C.), 2,2,6-trimethylcyclohexanone (179° C.), cycloheptanone (179° C.), hexylacetate (169° C.), amylbutyrate (185° C.), isopropyl lactate (167° C.), butyllactate (186° C.), ethyl-3-hydroxybutyrate (170° C.), ethyl-3-ethoxypropionate (170° C.), ethyl-3-hydroxy butyrate (180° C.), propyl-2-hydroxy-propionate (169° C.), propyleneglycoldiacetate (186° C.), propyleneglycolbutylether (170° C.), propyleneglycol methylether propionate (160° C.), diethyleneglycol dimethyl ether (162° C.), diethyleneglycol dimethyl ether acetate (165° C.), dipropyleneglycolmethylether (188° C.), dipropyleneglycoldimethylether (171° C.), ethyleneglycolbutylether (171° C.), diethyleneglycolmethylethylether (176° C.), diethyleneglycolmethylisopropylether (179° C.), diethyleneglycoldiethylether (189° C.), butylbutyrate (165° C.), ethyl-3-ethoxypropionate (170° C.), diethyleneglycolmonomethylether (194° C.), 4-ethylcyclohexanone (193° C.), and 2-butoxyethylacetate (192° C.), but the second solvent is not limited thereto.

As the third solvent, there may be one or more selected from the group consisting of diethyleneglycolmonoethylether (202° C.), butyrolactone (204° C.), hexylbutylate (205° C.), diethyleneglycolmethyletheracetate (209° C.), diethyleneglycolbutyl methyl ether (212° C.), tripropylglycoldimethyl ether (215° C.), triethyleneglycoldimethylether (216° C.), diethyleneglycolethyletheracetate (217° C.), diethyleneglycolbutyletheracetate (245° C.), 3-epoxy-1,2-propanediol (222° C.), ethyl-4-acetylbutyrate (222° C.), diethyleneglycolmonobutylether (231° C.), tripropylglycolmethyl ether (242° C.), diethyleneglycol (245° C.), 2-(2-butoxyethoxy)ethylacetate (245° C.), catechol (245° C.), triethyleneglycol methylether (249° C.), diethyleneglycoldibutylether (256° C.), triethyleneglycol ethylether (256° C.), diethyleneglycolmonohectylether (260° C.), triethyleneglycol butyl methyl ether (261° C.), triethyleneglycolbutylether (271° C.), tripropylglycol (273° C.), and tetraethyleneglycoldimethylether (276° C.), but the third solvent is not limited thereto.

The photosensitive resin composition according to the exemplary embodiment of the present invention may further comprise a colorant according to the purpose.

As the colorant, one or more pigments, dyes, or mixtures thereof may be used. In detail, a coloring dispersion solution comprising a black pigment may be used. As the usable carbon black, Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF manufactured by Donghae Carbon, Co., Ltd.; Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, OIL7B, OIL9B, OIL11B, OIL30B, and OIL31B manufactured by Mitsubishi Chemical, Co., Ltd.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 manufactured by Degussa, Co., Ltd.; and RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 manufactured by Columbia Carbon, Co., Ltd. may be used.

As the coloring pigment usable while being mixed with the carbon black, there may be Carmin 6B (C.I. 12490), Phthalocyanine GREEN (C.I. 74260), Phthalocyanine BLUE (C.I. 74160), Mitsubishi Carbon Black MA100, Perylene BLACK (BASF K0084. K0086), Cyanin BLACK, Linol YELLOW (C.I. 21090), Linol YELLOW GRO (C.I. 21090), Benzidin YELLOW 4T-564D, Mitsubishi Carbon black MA-40, Victoria PURE BLUE (C.I. 42595), C.I. PIGMENT RED 97, 122, 149, 168, 177, 180, 192, 215, C.I. PIGMENT GREEN 7, 36, C.I. PIGMENT 15:1, 15:4, 15:6, 22, 60, 64, C.I. PIGMENT 83, 139 and C.I. PIGMENT VIOLET 23, and in addition to this, a white pigment, and a fluorescent pigment may be used.

The content of the colorant may be 5 to 20 wt % on the basis of the total weight of the photosensitive resin composition.

In addition, the photosensitive resin composition according to the exemplary embodiment of the present invention may further comprise one or more additives selected from the group consisting of a dispersing agent, an adhesion promoting agent, an antioxidant, a UV absorbing agent, a thermal polymerization inhibitor, and a leveling agent.

As the adhesion promoting agent, one or more selected from the group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxy silane, 3-aminopropyltriethoxysilane, 3-glycidoxypropyltriethoxysilane, 3-glycidoxypropylmethyldimethoxysilane, 2-(3,4-ethoxy cyclohexyl)ethyltrimethoxysilane, 3-chloropropyl methyldimethoxysilane, 3-chloropropyl trimethoxy silane, 3-methacryloxypropyltrimethoxysilane, and 3-mercaptopropyltrimethoxysilane may be used.

As the antioxidant, 2,2-thiobis(4-methyl-6-t-butylphenol), or 2,6-g,t-butylphenol may be used, and as the UV absorbing agent, 2-(3-t-butyl-5-methyl-2-hydroxyphenyl)-5-chloro-benzotriazole, or alkoxy benzophenone may be used.

As the thermal polymerization inhibitor, hydroquinone, p-methoxyphenol, di-t-butyl-p-cresol, pyrogarol, t-butylcatechol, benzoquinone, 4,4-thiobis(3-methyl-6-t-butylphenol), 2,2-methylenebis(4-methyl-6-t-butylphenol), or 2-mercaptoimidazole may be used.

In addition to this, the photosensitive resin composition may further comprise one or more secondary additives selected from the group consisting of a carbon black dispersion material, a resin binder having functionality, a multi-functional monomer, a radiation sensitive compound, and other additives.

In addition, the exemplary embodiment of the present invention provides a photosensitive material formed by using the photosensitive resin composition.

The photosensitive resin composition according to the exemplary embodiment of the present invention is preferably used in a pigment dispersion type photosensitive material for manufacturing a TFT LCD color filter, a photosensitive material for forming a black matrix of a TFT LCD or organic light emitting diode, a photosensitive material for forming an overcoat layer, and a column spacer photosensitive material, or may be used in manufacturing a photosensitive material for a photocurable paint, photocurable ink, photocurable adhesive, a printed board, and a printed circuit board, and other transparent photosensitive materials and PDPs, and the purpose thereof is not particularly limited. Particularly, it is preferable that the photosensitive resin composition according to the exemplary embodiment of the present invention be used in a photosensitive material for color filter or a photosensitive material for black matrix.

In addition, a method of manufacturing a photosensitive material according to the exemplary embodiment of the present invention comprises 1) coating the photosensitive resin composition on a substrate, and 2) exposing and developing the coated photosensitive resin composition.

In the method for manufacturing the photosensitive material according to the exemplary embodiment of the present invention, step 1) is a step for coating the photosensitive resin composition, and for example, the resin may be coated on the substrate by using a method that is known in the art. In more detail, as the method for coating the photosensitive resin composition, a spray method, a roll coating method, a spin) coating method, a bar coating method, and a slit coating method may be used, but the method is not limited thereto.

In this case, the substrate may use metal, paper, glass, plastic, silicon, polycarbonate, polyester, aromatic polyamide, polyamideimide, and polyimide, and in respects to these substrates, appropriate pretreatment such as chemical treatment by a silane coupling agent, plasma treatment, ion plating, sputtering, a vapor reaction method, and vacuum deposition may be performed for the purpose. In addition, a thin film transistor for driving may be disposed on the substrate, and a nitrated silicon film may be sputtered.

In the method for manufacturing the photosensitive material according to the exemplary embodiment of the present invention, step 2) is a step for exposing and developing the coated photosensitive resin composition.

In more detail, the pattern may be formed by irradiating UV through a predetermined pattern mask to the prebaked coat film and removing an unnecessary portion by developing the film in an alkaline aqueous solution. In this case, as the developing method, a dipping method and a shower method may be used without a limitation. A developing time is generally about 30 to 180 sec. As the developing solution, as an alkaline aqueous solution, inorganic alkalines such as sodium hydroxide, potassium hydroxide, sodium silicate, methsodium silicate, and ammonia; primary amines such as ethylamine, N-propylamine; secondary amines such as diethylamine, and di-n-propylamine; tertiary amines such as trimenylamine, methyldiethylamine, and dimethylethylamine; tertiary alcohol amines such as dimethylethaneolamine, methyldiethaneolamine, and triethaneolamine; tertiary cycloamines such as pyrrole, piperidine, n-methylpiperidine, n-methylpyrrolidine, 1,8-diazabicyclo[5.4.0]-7-undecene, 1,5-diazabicyclo[4.3.0]-5-nonene; tertiary aromatic amines such as pyridine, colizine, lutidine, and quirroline; and an aqueous solution of quaternary ammonium salt such as tetramethylammoniumhydroxide, and tetraethylammoniumhydroxide may be used.

After the developing, water washing is performed for about 30 to 90 sec, and drying is performed with air or nitrogen, thereby forming the pattern. This pattern may be post-baked by using a heating device such as a hot plate, and an oven, thereby obtaining a final photosensitive material pattern. In this case, the post-baking may be performed at 150 to 250° C. for 10 to 90 min.

As a light source for curing the photosensitive resin composition of the exemplary embodiment of the present invention, for example, there are a mercury vapor arc, a carbon arc, and a Xe are emitting light having a wavelength of 250 to 450 nm, but the light source is not limited thereto.

The photosensitive material according to the exemplary embodiment of the present invention is advantageous in that surface defect free, developing, light blocking, and insulating properties are excellent, the adhesion property to the substrate is excellent, and impact resistance after a substrate attachment process, a liquid crystal injection process, and panel manufacturing is excellent.

Particularly, in the exemplary embodiment of the present invention, when the high light blocking black composition is developed so as to be applied to each process condition maximally tuned in order to maximize production of the industry, it is possible to obtain a black matrix film having excellent adhesion property to the substrate by optimizing the structure and ratio of the multi-functional monomers.

Mode for Invention

A better understanding of the present invention may be obtained in light of the following Examples which are set forth to illustrate, but are not to be construed to limit the present invention. In addition, the content of constitution component of the following Example is on the basis of 2,000 parts by weight of the total weight of the composition.

EXAMPLE

Example 1

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 20 parts by weight of KAYARAD DPEA-60 manufactured by Nippon Kayaku, Co., Ltd. as the multi-functional monomer, 20 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

The coat having a thickness of about 1.22 μm was formed by spin coating the manufactured photosensitive resin composition solution on glass, performing reduced pressure drying (VCD) to 65 Pa, and performing preheating at about 100° C. for 2 min. Thereafter, after cooling at room temperature, the entire surface was exposed to measure the adhesion strength to the substrate, and post-baked in the convection oven at 230° C. for 100 min. In addition, exposure was performed by using the photomask under the high pressure mercury lamp with energy of 30 mJ/cm$^2$ in order to confirm the developing property and the pattern shape. The exposed substrate was developed in the spray manner in the 0.04% KOH aqueous solution at 25° C., washed with pure water, dried, and post-baked in the convection oven at 230° C. for 20 min.

The obtained film had the thickness of 1.1 μm, there was no pattern removal, and the high light blocking property with optical density of 5.0 or more was exhibited. In addition, as confirmed in the results of the following Table 1 and FIG. 1, the adhesion strength to the substrate, the pattern shape, and the surface property were excellent.

Example 2

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 20 parts by weight of KAYARAD DPCA-60 manufactured by Nippon Kayaku, Co., Ltd. as the multi-functional monomer, 20 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

Figure 2:
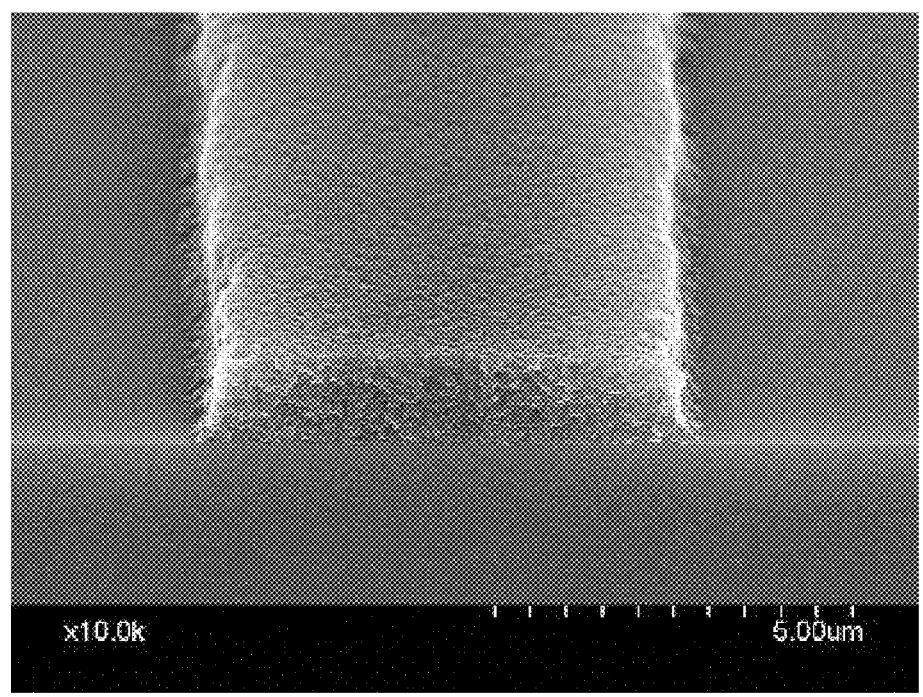
FIG. 2 is a microscopic picture of a black matrix film of Example 2 of an exemplary embodiment of the present invention.

When the coat was formed through the process of Example 1, the film had the thickness of 1.1 μm, there was no pattern removal, and the high light blocking property with optical density of 5.0 or more was exhibited. In addition, as confirmed in the results of the following Table 1 and FIG. 2, the adhesion strength to the substrate, the pattern shape, and the surface property were excellent.

Example 3

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 16 parts by weight of KAYARAD DPCA-60 manufactured by Nippon Kayaku, Co., Ltd. as the multi-functional monomer, 24 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

Figure 3:
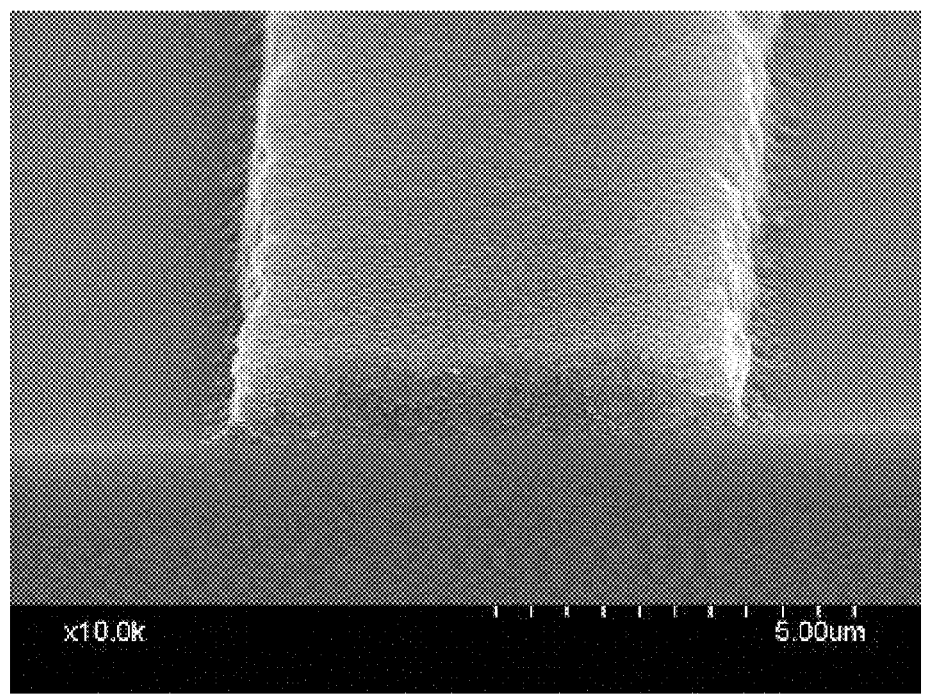
FIG. 3 is a microscopic picture of a black matrix film of Example 3 of an exemplary embodiment of the present invention.

When the coat was formed through the process of Example 1, the film had the thickness of 1.1 μm, there was no pattern removal, and the high light blocking property with optical density of 5.0 or more was exhibited. In addition, as confirmed in the results of the following Table 1 and FIG. 3, the adhesion strength to the substrate, the pattern shape, and the surface property were excellent.

Example 4

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 24 parts by weight of KAYARAD DPCA-60 manufactured by Nippon Kayaku, Co., Ltd. as the multi-functional monomer, 16 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

Figure 4:
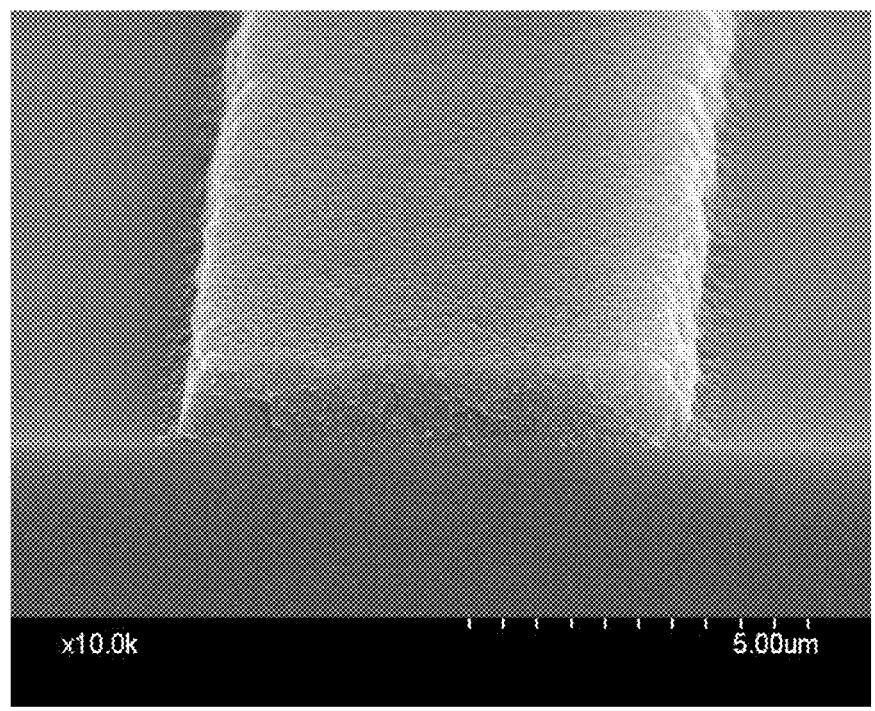
FIG. 4 is a microscopic picture of a black matrix film of Example 4 of an exemplary embodiment of the present invention.

When the coat was formed through the process of Example 1, the film had the thickness of 1.1 μm, there was no pattern removal, and the high light blocking property with optical density of 5.0 or more was exhibited. In addition, as confirmed in the results of the following Table 1 and FIG. 4, the adhesion strength to the substrate, the pattern shape, and the surface property were excellent.

Example 5

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 12 parts by weight of KAYARAD DPCA-60 manufactured by Nippon Kayaku, Co., Ltd. as the multi-functional monomer, 28 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

Figure 5:
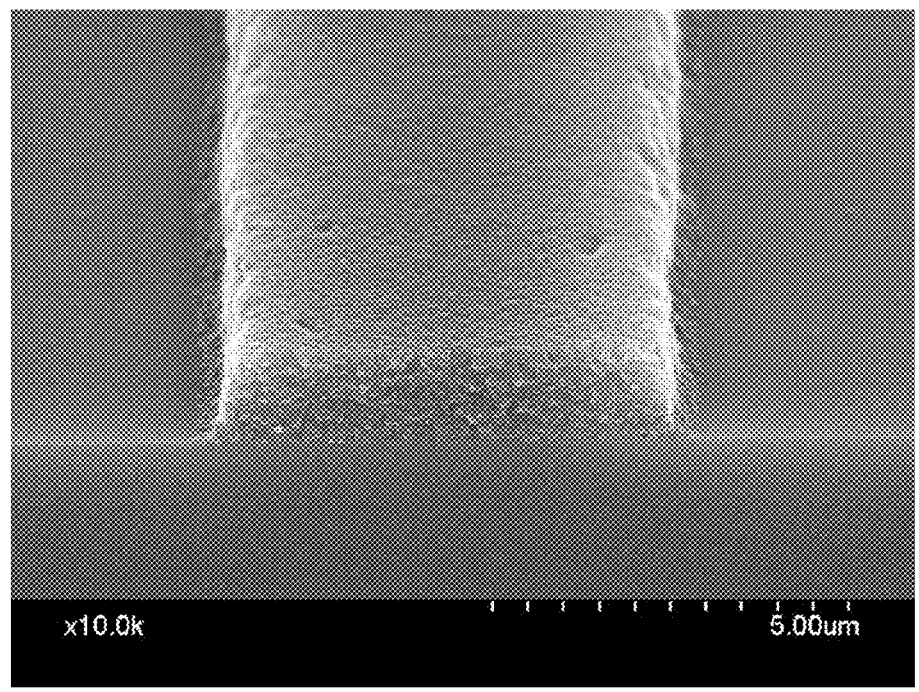
FIG. 5 is a microscopic picture of a black matrix film of Example 5 of an exemplary embodiment of the present invention.

When the coat was formed through the process of Example 1, the film had the thickness of 1.1 μm, there was no pattern removal, and the high light blocking property with optical density of 5.0 or more was exhibited. In addition, as confirmed in the results of the following Table 1 and FIG. 5, the adhesion strength to the substrate, the pattern shape, and the surface property were excellent.

Example 6

900 parts by weight of the carbon dispersion solution (carbon content of 20%), 53 parts by weight of the alkali-soluble resin binder (molar ratio of bisphenol fluorene epoxy acrylate added with the acrylic acid/1,3-cyclohexyldiisocyanate (65/35, Mw=5,000, and acid value of 80 KOH mg/g)), 28 parts by weight of KAYARAD DPCA-60 manufactured by Nippon Kayaku, Co., Ltd. as the multi-functional monomer, 12 parts by weight of dipentaerythritol hexamethaacrylate, 20 parts by weight of ethanon-1-(9-ethyl)-6-(2-methylbenzoyl-3-yl)-1-(o-acetyloxime) as the photoinitiator, 5 parts by weight of 3-methaacryloxypropyltrimethoxysilane as the adhesion promoting agent, 1 part by weight of octadecyltrimethoxy silane, 1 part by weight of the leveling agent, 300 parts by weight of propylene glycol monomethyl ether acetate as the solvent, 550 parts by weight of 3-methoxybutylacetate, and 130 parts by weight of dipropyleneglycol monomethylether were mixed. Thereafter, the black matrix photosensitive resin composition was manufactured by agitating the mixture for 5 hours.

Figure 6:
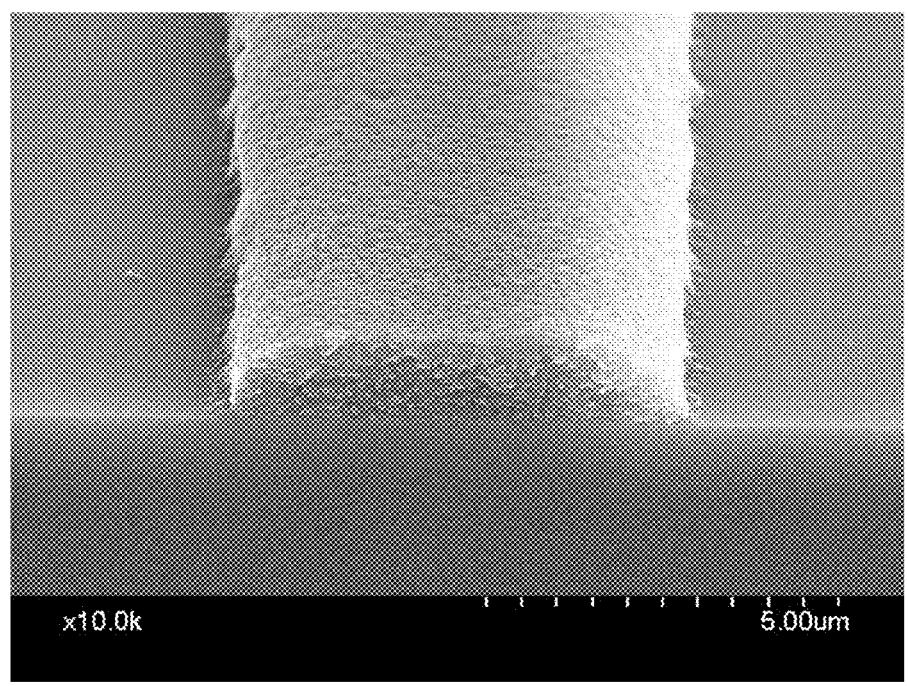
FIG. 6 is a microscopic picture of a black matrix film of Example 6 of an exemplary embodiment of the present invention.

When the coat was formed through the process of Example 1, the film had the thickness of 1.1 μm, there was no pattern removal, and the high light blocking property with optical density of 5.0 or more was exhibited. In addition, as confirmed in the results of the following Table 1 and FIG. 6, the adhesion strength to the substrate, the pattern shape, and the surface property were excellent.

Comparative Example 1

The black matrix photosensitive resin composition was manufactured by using the same composition as Example 1, except that 40 parts by weight of the dipentaerythritol hexamethaacrylate was used alone as the multi-functional monomer.

When the coat was formed through the process of Example 1, the film had the thickness of 1.1 μm, the pattern removal and the straight surface property were excellent, but as confirmed in the results of the following Table 1, the adhesion strength to the substrate was low.

Comparative Example 2

The black matrix photosensitive resin composition was manufactured by using the same composition as Example 1, except that 40 parts by weight of KAYARAD DPCA-60 manufactured by Nippon Kayaku, Co., Ltd. was used alone as the multi-functional monomer.

Figure 7:
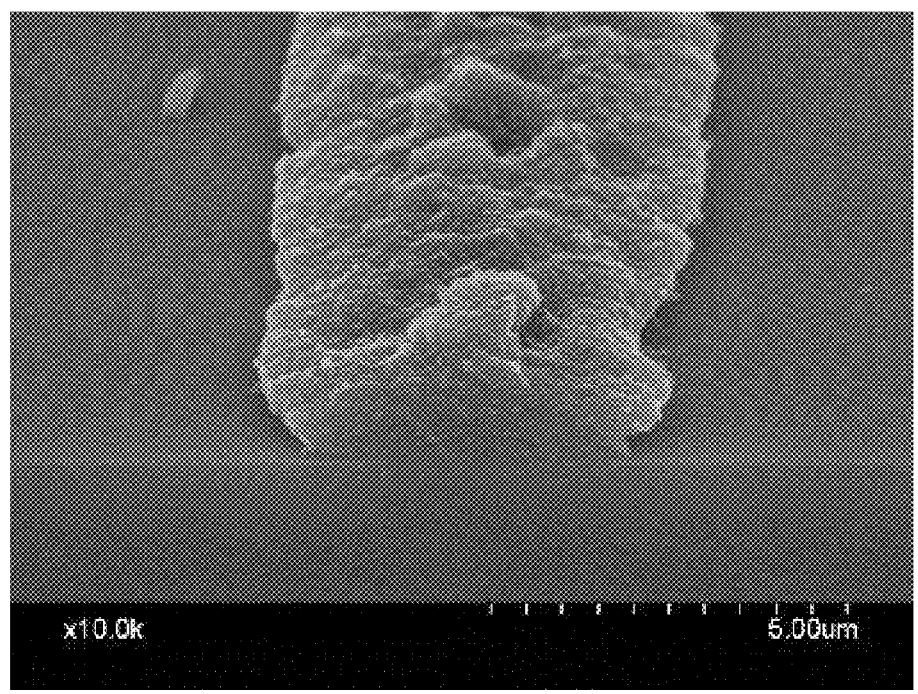
FIG. 7 is a microscopic picture of a black matrix film of Comparative Example 2 of an exemplary embodiment of the present invention.

When the coat was formed through the process of Example 1, as confirmed in the results of the following Table 1 and FIG. 7, the adhesion strength to the substrate was excellent, but the surface of the pattern was etched by the developing solution due to low exposure sensitivity, such that the thickness of the film was decreased and the surface property was not good.

Comparative Example 3

The black matrix photosensitive resin composition was manufactured by using the same composition as Example 1, except that 20 parts by weight of KAYARAD DPCA-20 manufactured by Nippon Kayaku, Co., Ltd., and 20 parts by weight of dipentaerythritol hexamethacrylate were used as the multi-functional monomer.

When the coat was formed through the process of Example 1, as confirmed in the results of the following Table 1, the adhesion strength to the substrate was low.

Experimental Example

Evaluation Experiment of the Adhesion Property to the Substrate

After the black matrix substrates obtained in Examples 1 to 6 and Comparative Examples 1 to 3 were screen printed by using the sealant for glass attachment, bare glass was attached to the black matrix substrate and heat cured in the convection oven at 160° C. for 2 hours. The obtained sample was push tested at a rate of 5 mm/min and force at a point at which the black matrix substrate was separated was measured. The aforementioned experiment was repeated nine times, and the average value was obtained.

In addition, the removal of the film surface by the developing solution was confirmed in the thickness ratio of the preserved film by measuring the film thicknesses before and after developing.

TABLE 1

| | Multi-functional monomer (wt %) | | Adhesion strength (N) | Film thickness after developing/ film thickness before developing |
|---|---|---|---|---|
| | First monomer | Second monomer | | |
| Example 1 | DPEA12 (50 wt %) | DPHA (50 wt %) | 4.6 | 0.976 |
| Example 2 | DPCA60 (50 wt %) | DPHA (50 wt %) | 5.0 | 0.977 |
| Example 3 | DPCA60 (40 wt %) | DPHA (60 wt %) | 5.0 | 0.979 |
| Example 4 | DPCA60 (60 wt %) | DPHA (40 wt %) | 5.1 | 0.971 |
| Example 5 | DPCA60 (30 wt %) | DPHA (70 wt %) | 4.7 | 0.978 |
| Example 6 | DPCA60 (70 wt %) | DPHA (30 wt %) | 5.2 | 0.973 |
| Comparative Example 1 | — | DPHA (100 wt %) | 3.5 | 0.976 |
| Comparative Example 2 | DPCA60 (100 wt %) | — | 5.1 | 0.787 |
| Comparative Example 3 | DPCA20 (50 wt %) | DPHA (50 wt %) | 4.0 | 0.977 |

In the photosensitive resin composition for black matrix according to the exemplary embodiment of the present invention, in the case where the content of the first monomer is less than 30 wt % on the basis of the total weight of the multi-functional monomer, it is difficult to obtain sufficient adhesion property to the substrate, and in the case where the content is more than 70 wt %, since the surface of the pattern is etched by the developing solution, the film thickness may be decreased and the surface property may become poor, which are not preferable.

Accordingly, from the results of Table 1, it can be seen that in the case where the black resist composition was manufactured through the combination ratio of the multi-functional monomers according to the exemplary embodiment of the present invention, the adhesion property to the substrate is improved as compared to a known composition, and excellent processability and pattern property are obtained.

What is claimed is:
1. A photosensitive resin composition, comprising:
an alkali-soluble binder resin,
a first monomer,
a second monomer,
a photoinitiator,
a solvent, and
adhesion promoting agents,
wherein the first monomer is represented by the following Formula 1 or Formula 2 and the second monomer is represented by the following Formula 5 or Formula 6 or is selected from the group consisting of pentaerythritol tetramethacrylate, pentaerythritol trimethacrylate, dipentaerythritol pentamethacrylate and dipentaerythritol hexamethacrylate,
wherein the photoinitiator comprises a photocrosslinking sensitizer or a curing promoter,
wherein the photocrosslinking sensitizer is selected from the group consisting of benzophenone, 2,4,6-trimethylaminobenzophenone, methyl-o-benzoylbenzoate, 3,3-dimethyl-4-methoxybenzophenone, 3,3,4,4-tetra(t-butylperoxycarbonyl)benzophenone, 9-fluorenone, 2-chloro-9-fluorenone, 2-methyl-9-fluorenone, thioxantone, 2,4-diethyl thioxantone, 2-chloro thioxantone, 1-chloro-4-propyloxy thioxantone, isopropylthioxantone, diisopropylthioxantone, xantone, 2-methylxantone, anthraquinone, 2-methyl anthraquinone, 2-ethyl anthraquinone, t-butyl anthraquinone, 2,6-dichloro-9,10- anthraquinone, 9-phenylacridine, 1,7-bis(9-acridinyl)heptane, 1,5-bis(9-acridinylpentane), 1,3-bis(9-acridinyl)propane, benzyl, 1,7,7-trimethyl-bicyclo2,2,1 heptane-2,3 -dione, 9,10-penanthrenequinone, 2,4,6-trimethylbenzoyl diphenylphosphine oxide, bis(2,6-dimethoxybenzoyl)-2,4,4- trimethylpentyl phosphine oxide, methyl-4-(dimethylamino)benzoate, ethyl-4-(dimethylamino)benzoate, 2-n-butoxyethyl-4-(dimethylamino)benzoate, 2,5-bis(4-diethylaminobenzale)cyclopentanone, 2,6-bis(4-diethylaminobenzale) cyclohexanone, 2,6-bis(4-diethylaminobenzale)-4-methyl-cyclopentanone, 3,3-carbonylvinyl-7-(diethylamino)coumarine, 3-(2-benzothiazolyl)-7-(diethylamino)coumarine, 3-benzoyl-7-(diethylamino) coumarine, 3 -benzoyl-7-methoxy-coumarine, 10,10-carbonylbis [1,1,7,7-tetramethyl-2,3,6,7-tetrahydro-1H,5H,11H—C1]-benzopyrano [6,7,8 -ij]-quinolizine- 11-one, 4-diethylamino chalcone, 4-azidebenzaleacetophenone, 2-benzoylmethylene, and 3-methyl-b-naphthothiazoline,
wherein the curing promoter is selected from the group consisting of 2-mercaptobenzoimidazole, 2,5-dimercapto-1,3,4-thiadiazole, 2-mercapto-4,6-dimethylaminopyridine, pentaerythritol-tetrakis(3-mercaptopropionate), pentaerythritol-tris(3 -mercaptopropionate), pentaerythritol-tetrakis(2-mercaptoacetate), pentaerythritol-tris(3-mercaptopropionate), pentaerythritol-tetrakis(2-mercaptoacetate), pentaerythritol-tris(2-mercaptoacetate), and trimethylolpropane-tris(2-mercaptoacetate), and trimethylolpropane-tris(3-mercaptopropionate),
wherein the solvent comprises three or more selected from the group consisting of a first solvent having a boiling point in the range of 140 to 159° C., a second solvent having a boiling point in the range of 160 to 179 ° C., and a third solvent having a boiling point in the range of 180 to 280° C.,
wherein an average boiling point of the total solvent in the range of 140 to 170° C., wherein the alkali-soluble binder is represented by the following Formula 7, and
wherein the adhesion promoting agents are methaacryloxypropyltrimethoxysilane and octadecyltrimethoxy silane,

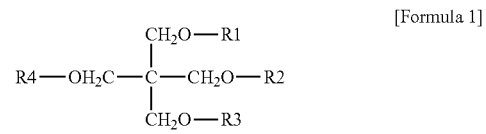

[Formula 1]

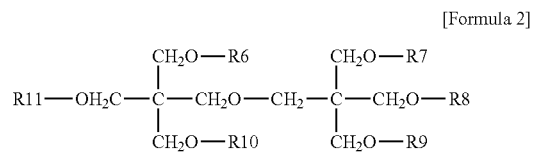

[Formula 2]

wherein
at least one of R1 to R4 and at least one of R6 to R11 are represented by the following Formula 3, and remains are each independently hydrogen, a halogen group, or represented by the following Formula 4,

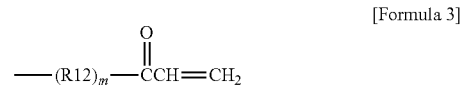

[Formula 3]

wherein
R12 is an alkyleneoxide group or 6-hexanoate group, and m is 1 to 18,

[Formula 4]

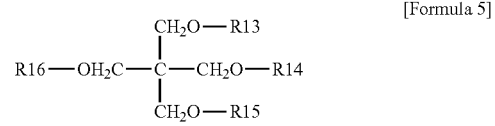

[Formula 5]

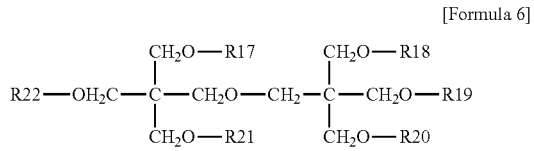

[Formula 6]

wherein
at least two of R13 to R16 and at least two of R17 to R22 are represented by Formula 4, and remains are each independently hydrogen or a halogen group, and

[Formula 7]

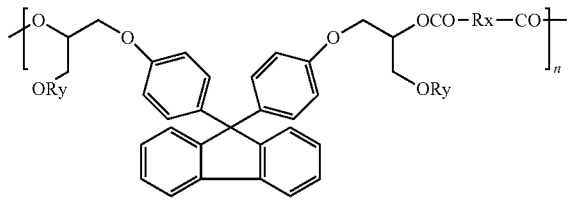

wherein Rx is a structure that forms an ester bond by addition reacting pentanary cyclic carboxylic anhydride or diisocyanate, Ry is selected from hydrogen, acryloyl, and methacrylolyl and n is 3 to 8.

2. The photosensitive resin composition according to claim 1, wherein a content of the first monomer is 30 to 70 wt% on the basis of a total weight of the first and second monomers.

3. The photosensitive resin composition according to claim 1, wherein the second monomer comprises one or more selected from the group consisting of pentaerythritol tetra(meth)acrylate, pentaerythritol tri(meth)acrylate, dipentaerythritol penta(meth)acrylate and dipentaerythritol hexa(meth)acrylate.

4. The photosensitive resin composition according to claim 1, wherein a content of the first and second monomers is 1 to 10 wt% on the basis of a total weight of the photosensitive resin composition.

5. The photosensitive resin composition according to claim 1, wherein a content of the alkali-soluble binder resin is 1 to 10 wt%, a content of the photoinitiator is 0.5 to 5 wt%, and a content of the solvent is 65 to 90 wt% on the basis of the total weight of the photosensitive resin composition.

6. The photosensitive resin composition according to claim 1, further comprising:
a colorant.

7. The photosensitive resin composition according to claim 6, wherein a content of the colorant is 5 to 20 wt% on the basis of a total weight of the photosensitive resin composition.

8. The photosensitive resin composition according to claim 1, further comprising:
one or more additives selected from the group consisting of a dispersing agent, an antioxidant, a UV absorbing agent, a thermal polymerization inhibitor, and a leveling agent.

9. A photosensitive material formed by using a method of manufacturing a photosensitive material, comprising:
(1) coating the photosensitive resin composition according to claim 1 on a substrate, and
(2) exposing by light and developing the coated photosensitive resin composition.

10. The photosensitive material according to claim 9, wherein the photosensitive material is selected from the group consisting of a pigment dispersed photosensitive material for manufacturing a color filter, a photosensitive material for forming a black matrix, a photosensitive material for forming an overcoat layer, a column spacer photosensitive material, and a photosensitive material for a printed circuit board.

11. A method of manufacturing a photosensitive material, comprising:
1) coating the photosensitive resin composition according to claim 1 on a substrate, and
2) exposing to light and developing the coated photosensitive resin composition.

* * * * *